United States Patent [19]

Hayden et al.

[11] Patent Number: 4,827,227
[45] Date of Patent: May 2, 1989

[54] STEP TRANSITION TIME REDUCTION FOR FILTERED OSCILLATORS

[75] Inventors: Leonard A. Hayden, Corvallis; Robert W. Bales, Portland, both of Oreg.

[73] Assignee: Tektronix, Inc., Beaverton, Oreg.

[21] Appl. No.: 219,496

[22] Filed: Jul. 15, 1988

[51] Int. Cl.$^4$ ............................................... H03B 7/12
[52] U.S. Cl. .......................................... 331/179; 331/96
[58] Field of Search ........ 331/34, 96, 107 R, 107 DP, 331/117 D, 177 R, 179; 333/235; 332/18

[56] References Cited

U.S. PATENT DOCUMENTS 4,672,632  6/1987  Andersen ........................ 375/18 X Primary Examiner—David Mis
Attorney, Agent, or Firm—Francis I. Gray

[57] ABSTRACT

A step transition time reduction technique for a YIG oscillator having a capacitive filter uses an inverse transfer function to produce a predistorted drive step signal from an input drive step signal, the predistorted drive step signal being used to drive the YIG oscillator. The inverse transfer function uses R,L,C values from the oscillator circuit to generate an intermediate step in the input drive step signal, the value of the step being determined by a factor $k=1/(1+e^{-a*pi/b})$ and the duration of the step being determined by a delay time $dt=pi/b$, where $a=R/(2L)$ and $b=(1/(LC)-R^2/(4L^2))^{\frac{1}{2}}$.

7 Claims, 1 Drawing Sheet

STEP TRANSITION TIME REDUCTION FOR FILTERED OSCILLATORS

BACKGROUND OF THE INVENTION

The present invention relates to oscillators, and more particularly to the reduction of step transition times for a YIG oscillator having an FM filter capacitor for noise reduction by predistorting a drive current for the YIG oscillator.

In high frequency applications requiring frequencies in the gigahertz range YIG (yttrium-iron-garnet) oscillators are used. These oscillators consist of YIG spheres that are subjected to high magnetic fields, the strength of the magnetic field determining the frequency of operation of the YIG spheres. A drive circuit for a YIG oscillator has a main tuning coil having distributed inductance L and resistance R that is driven by a current source. The strength of the magnetic field is a function of the amplitude of the current i(t) from the current source. A capacitor C is sometimes placed in parallel with the main tuning coil to stabilize the YIG oscillator by filtering noise present on the main coil tuning current $i_L(t)$. An equivalent circuit for a YIG oscillator having a stabilizing capacitor is illustrated in FIG. 1. The capacitor C has the disadvantage of significantly extending the time required for the oscillator to restabilize after a step frequency change, i.e., a step change in the drive current i(t). As shown in FIG. 2 the drive current i(t) from the current source is modified by a transfer function that is a function of the circuit components to produce the main coil tuning current $i_L$ that has appreciable ringing at the edge of the step transition so that the frequency is not stable until some time, dt, after the step change is initiated. In other words $$i_L(t) = T * i(t)$$

where T is the transform function $T = f(R,L,C)$.

What is desired is a method and apparatus for reducing the step transition times for a YIG oscillator with a filter capacitor.

SUMMARY OF THE INVENTION

Accordingly the present invention provides a step transition time reduction technique for a YIG oscillator by predistorting the drive current from a current source so that the main coil tuning current achieves a stable state after such step transition in a minimum amount of time. The desired drive current is input to a transfer function that is the inverse of that created by the resistance, inductance and capacitance associated with the main coil. As a result of the combination of the transfer functions the current main coil tuning current is nearly the same as the drive current. For a step input the inverse transfer function delivers a fixed percentage of the step immediately and the remainder of the step after a precise time interval. The time interval for the intermediate step is a constant independent of drive current. The two parameters, percentage and time interval, are a function of the distributed inductance and resistance of the main tuning coil of the YIG oscillator and the filter capacitance. This drive current may be determined digitally by a microprocessor controller that generates the appropriate two step drive current sequence.

The objects, advantages and novel features of the present invention are apparent from the following detailed description when read in conjunction with the appended claims and attached drawing.

DESCRIPTION OF THE PREFERRED EMBODIMENT

Figure 1:
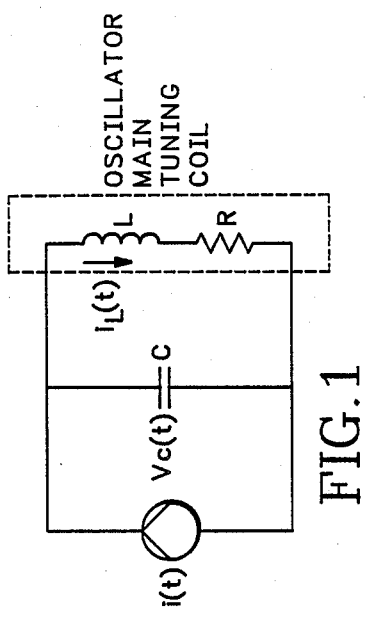
FIG. 1 is an equivalent schematic diagram for a YIG oscillator drive circuit.
Figure 2:
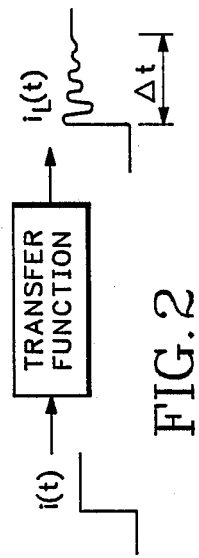
FIG. 2 is an illustration of the effect of the circuit of FIG. 1 upon a step drive current input to the main tuning coil of the YIG oscillator.
Figure 3:
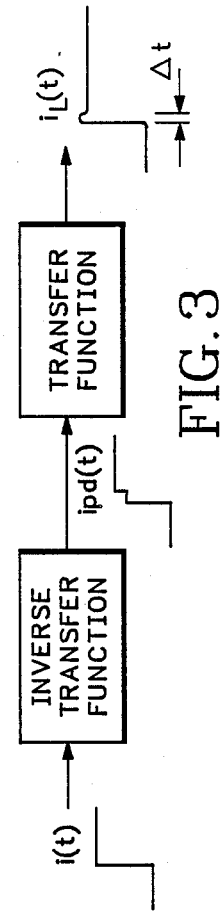
FIG. 3 is a block diagram of a technique for reducing the step transition time of the main tuning coil drive current according to the present invention.
Figure 4:
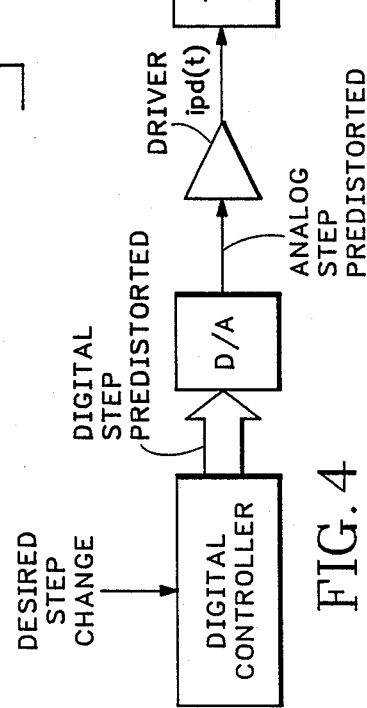
FIG. 4 is a block diagram of a digital apparatus for implementing the technique of FIG. 3.

Referring now to FIG. 3 the drive current i(t) is input to an inverse transform function $T^{-1}$ that is a function of (R,L,C) to produce a predistorted drive current $i_{pd}(t)$. This predistorted drive current is then input to the circuit transfer function T to produce the main coil tuning current $i_L(t)$ that more closely approaches the step transition of the drive current i(t), substantially reducing the settling time. A digital implementation is shown in FIG. 4 where for a given frequency step change a digital controller outputs a digital predistorted step signal that is input to a digital to analog (D/A) converter to produce an analog step predistorted signal. The analog step predistorted signal is input to the YIG driver to generate the predistorted drive current $i_{pd}(t)$. The predistorted drive current is then acted upon by the circuit transfer function as in FIG. 3 to produce the desired step main coil tuning current.

The inverse transfer function is derived as follows, where $$i(t) = A_1(t) = C * dv_c/dt + i_L(t)$$

and the voltage across the capacitor C is $$v_c(t) = L * di_L/dt + R * i_L(t).$$

It can be shown that $$(1/LC) * i(t) = d^2 i_L / dt^2 + (R/L) * di_L/dt + (1/LC) * i_L(t).$$

The solution has two parts: a complementary solution $i_{LC}$ containing initial conditions and the passive response of the system, i.e., that for the input i(t)=0; and a particular solution $i_{LP}$ being the response to driving signal i(t), i.e., $i_{LP} = A_1$. The sum of these solutions covers the whole solution space so that:

$$i_L(t) = i_{LP} + i_{LC}$$
$$= A_1 + e^{-at}(c_1 \cos(bt) + c_2 \sin(bt))$$

where $$a = R/2L$$

and $$b = (1/LC - R^2/4L^2)^{\frac{1}{2}}$$

for $(1/LC - R^2/4L^2) > 0$, a being the real decay component and b being the oscillatory component.

Since inductor current cannot change instantaneously, $i_L(0+)=i_L(0-)$ and $di_L/dt(0)=0$, then the constants $$c_1 = -(A_1 - i_L(0-)).$$

and $$c_2 = -(a/b)(A_1 - i_L(0-)).$$

The main coil tuning current $$i_L(t) = A_1 - (A_1 - i_L(0-))e^{-at}(\cos(bt) + (a/b)\sin(bt))$$

where $A_1$ is the final, settled value, $i_L(0-)$ is the value before step is applied and $(A_1 - i_L(0-))$ is the change in driving current. Applying a current
$I_{pd}(t) = 1/kA1u(t) + (1-1/k)u(t-dt)$,
using superposition to find the current $i_L(t)$ for $t > dt$, and choosing $dt = pi/b$, then the resultant solution is:

$$i_L(t) = A1 + c3*\exp(-at)(\cos(bt) + (a/b)\sin(bt)).$$

If $k = 1/(1 + \exp(-a*pi/b))$, then $c3 = 0$ and $i_L(t) = A1$, the desired condition, for $t > dt$. Thus $$dF_1 = kdF_T$$

where $dF_T$ is the total desired frequency change and $dF_1$ is the intermediate frequency held for $$dt = pi/b.$$

Using the equations for a and b which are functions of R, L and C, the two key parameters k (fraction of total desired change) and dt (delay time) may be calculated.

Again referring to FIG. 4 a desired frequency step change is input to the digital controller. Based upon the parameters of the oscillator/capacitor circuit for the main coil, the digital controller computes the values for k and dt and outputs an immediate step change equal to $kF_T$ to the digital to analog converter. After the time interval dt the digital controller outputs the remainder of the step $(F_T - kF_T)$ to the digital to analog converter. The two incremental steps output by the digital controller at the time interval dt in response to the input desired frequency step results in the desired main coil tuning current that reduces the ringing at the front edge of the step transition.

Thus the present invention provides a reduction in the step transition time of a YIG oscillator with a filter capacitor by predistorting a drive current for the YIG oscillator by a providing an intermediate step in the drive current that is a fraction of the total step and a delay time for the intermediate step, such parameters being readily calculated as a function of the circuit R, L and C values.

What is claimed is:

1. A method for reducing step transition times for an oscillator having a capacitive filter comprising the steps of:
   inputting a step signal into an inverse transfer function to produce a predistorted drive signal; and
   inputting the predistorted drive signal to a transfer function representative of the oscillator and capacitive filter circuit to produce a main coil tuning current for the oscillator having an essentially step waveform.

2. A method as recited in claim 1 wherein the step signal inputting step comprises the steps of:
   calculating a delay time and a factor value from R,L,C values for the oscillator and capacitive filter circuit;
   multiplying the step signal by the factor value to produce the predistorted drive signal having an intermediate step with a value equal to the product; and
   outputting the predistorted drive signal, the intermediate step having a duration equal to the delay time.

3. An apparatus for reducing step transition times for an oscillator having a capacitive filter comprising:
   means for generating a drive step signal;
   means for modifying the drive step signal using an inverse transfer function to produce a predistorted drive step signal; and
   means for driving the oscillator with the predistorted drive step signal so that a main coil tuning signal for the oscillator has an essentially step waveform.

4. An apparatus as recited in claim 3 wherein the generating means comprises a current source modulated with a step amplitude function.

5. An apparatus as recited in claim 4 wherein the generating means comprises a digital look-up table that outputs a digital step value.

6. An apparatus as recited in claim 5 wherein the modifying means comprises:
   means for calculating from R,L,C values for the oscillator and capacitive filter circuit a delay time and a factor value;
   means for multiplying the digital step value by the factor value to produce a predistorted digital step signal having an intermediate step value determined by the product and of a duration determined by the delay time; and
   means for converting the predistorted digital step signal into the predistorted drive step signal to drive the oscillator.

7. An apparatus as recited in claim 6 wherein the converting means comprises:
   means for converting the predistorted digital step signal into an analog predistorted step signal; and
   means for generating the predistorted drive step signal from the analog predistorted step signal.

* * * * *